(12) United States Patent
Ohmatsu

(10) Patent No.: US 6,864,926 B2
(45) Date of Patent: Mar. 8, 2005

(54) CHANNEL TUNING APPARATUS

(75) Inventor: Takayuki Ohmatsu, Niihama (JP)

(73) Assignee: Matsushita Electric Industrial Co., Ltd. (JP)

(*) Notice: Subject to any disclaimer, the term of this patent is extended or adjusted under 35 U.S.C. 154(b) by 622 days.

(21) Appl. No.: 10/019,958

(22) PCT Filed: May 24, 2001

(86) PCT No.: PCT/JP01/04377
§ 371 (c)(1),
(2), (4) Date: Jan. 7, 2002

(87) PCT Pub. No.: WO01/93570
PCT Pub. Date: Dec. 6, 2001

(65) Prior Publication Data
US 2003/0007572 A1 Jan. 9, 2003

(30) Foreign Application Priority Data
May 29, 2000 (JP) .................................. 2000-157491

(51) Int. Cl.[7] .............................................. H04N 5/50
(52) U.S. Cl. .................... 348/731; 348/732; 455/180.1; 455/168.1; 455/186.1
(58) Field of Search ................... 348/731, 732, 348/733; 455/185.1, 186.1, 180.1, 168.1; H04N 5/50

(56) References Cited

U.S. PATENT DOCUMENTS 4,737,993 A * 4/1988 DeVilbiss ................ 455/180.1
5,087,977 A * 2/1992 Suizu ..................... 348/732
5,659,352 A * 8/1997 Lee ....................... 725/151
6,433,830 B1 * 8/2002 Groff et al. ............... 348/536

FOREIGN PATENT DOCUMENTS

JP 5-64094 3/1993
JP 7-123328 5/1995

* cited by examiner

Primary Examiner—Michael H. Lee
(74) Attorney, Agent, or Firm—Parkhurst & Wendel, L.L.P.

(57) ABSTRACT

A channel tuning apparatus which improves operability by eliminating a need for a user to select a CATV mode and allows reliable channel tuning without misjudging the presence or absence of signals even if a frequency of a CATV broadcast is shifted. The channel tuning apparatus includes a tuner (2) for receiving signals from an antenna (1), a demodulation unit (3) for demodulating the received signals coming from the tuner (2), an input unit (6) for selecting a specific channel for the tuner (2), a detection unit (4) for determining receive mode, and a memory unit (5) for storing the detected data by the detection unit (4), in which the channel tuning apparatus is configured to, before performing automatic channel tuning, tune to a specific channel determined by the input unit (6), detect the receive mode and shift in the received frequency, and store them for use as initial data for automatic channel tuning.

3 Claims, 7 Drawing Sheets (a) CATV MODE　　　(b) FREQUENCY MODE

FIG. 5

| CHANNEL | PRESENCE OF SIGNALS |
|---|---|
| 1 | ○ |
| 2 | × |
| 3 | ○ |
| 4 | ○ |
| ⋮ | ⋮ |
| 1 2 4 | × |
| 1 2 5 | × |

FIG. 6

| CH | STD BROADCAST | HRC BROADCAST | IRC BROADCAST |
|---|---|---|---|
| 1 | 75.00 | 73.75 | 75.00 |
| 2 | 57.00 | 55.75 | 57.00 |
| 3 | 63.00 | 61.75 | 63.00 |
| 4 | 69.00 | 67.75 | 69.00 |
| 5 | 79.00 | 77.75 | 81.00 |
| 6 | 85.00 | 83.75 | 87.00 |
| ⋮ | ⋮ | ⋮ | ⋮ |
| 65 | 471.00 | 469.75 | 471.00 |
| 66 | 477.00 | 475.75 | 477.00 |
| 67 | 483.00 | 481.75 | 483.00 |
| ⋮ | ⋮ | ⋮ | ⋮ |
| 123 | 789.00 | 787.75 | 789.00 |
| 124 | 795.00 | 793.75 | 795.00 |
| 125 | 801.00 | 799.75 | 801.00 |

CHANNEL TUNING APPARATUS

TECHNICAL FIELD

The present invention relates to a channel tuning apparatus for receiving digital television signals, especially signals of CATV broadcasting that has multiple receive modes.

BACKGROUND ART

Three broadcasting systems are used for CATV broadcasting in the USA: namely, Standard Cable TV Signals (STD), Harmonic Related Carrier (HRC), and Incremental Related Carrier (IRC) systems.

FIG. 6 shows picture carrier frequencies (unit: MHz) of the individual channels (hereinafter "channel" may be abbreviated to "CH") of the three CATV broadcasting systems. As shown in the figure, all the three CATV broadcasting systems, STD, HRC, and IRC, have different broadcasting frequencies in both CH5 and CH6. For broadcasting on CH5, for example, the STD system uses 79 MHz, HRC system uses 77.75 MHz, and IRC system uses 81 MHz. In this way, the broadcasting frequency varies with the broadcasting system.

Since different broadcasting systems use different broadcasting frequencies as described above, to receive signals of CATV broadcasting that has multiple receive modes, the channel tuning apparatus like conventional digital television signal receivers is configured to adopt the following procedures: when the presence or absence of signals on all channels are determined automatically, i.e., when automatic channel tuning is performed, a user must determine which broadcasting system is used on each channel for the CATV signals coming into the antenna terminal and then must set the receive mode that corresponds to the type of broadcasting system, on the channel tuning apparatus, before he/she can receive CATV broadcasts.

However, the conventional channel tuning apparatus described above has a problem of poor operability associated with the complex and troublesome manual operations during automatic channel tuning as described above.

Besides, with a CATV distribution system, in which the CATV broadcast signals sent from the central station are delivered to home users through a number of relay stations, it is necessary to take into consideration the fact that the signals may be frequency-shifted along the way due to some influence.

However, when the channel tuning apparatus such as a conventional digital television signal receiver is used for tuning, if the frequency of the desired channel is placed at the center as shown in FIG. 7, the frequencies within plus/minus 125 KHz from the frequency of the desired channel can be pulled in. This range is narrower by orders of magnitude than the pull-in range for typical analog signals, which is within plus/minus 1 MHz from the frequency of the desired channel.

Therefore, if the frequency of the signal delivered by a CATV broadcast exceeds the pull-in range of the desired channel selected by the user, there arises another problem that the conventional channel tuning apparatus cannot tune in the delivered signals.

As described above, the conventional channel tuning apparatus has poor operability during automatic channel tuning. Also, when selecting an unfamiliar CATV mode, the user may select a wrong mode, resulting in an inability to tune to a channel. Moreover, a proper channel cannot be tuned in if the frequency of the CATV broadcast signals is shifted from the frequency of the desired channel due to some influence.

The present invention has been made to solve the conventional problems described above. It provides a channel tuning apparatus which can improve operability by eliminating the need for a user to select an unfamiliar CATV mode during automatic channel tuning, allow reliable channel tuning without misjudging the presence or absence of signals even if the frequency of a CATV broadcast is shifted, and reduce the time required for automatic channel tuning.

DISCLOSURE OF THE INVENTION

To solve the above problems, a channel tuning apparatus of the present invention is configured to receive signals of CATV broadcasting having multiple broadcast modes, and detect and store a CATV broadcast mode and a frequency mode of a channel selected by a user during automatic channel tuning out of channels that carry signals or channel numbers that can be received, whereby each data thus stored is referred to as initial data for automatic channel tuning to tune in and pull in digital signals when the digital signals are received by a tuner.

This makes it possible to automatically determine a receive mode of a digital CATV broadcast. Then the next time, tuning can be started directly in that broadcast mode. Consequently, the present invention improves operability by eliminating a need for a user to select an unfamiliar CATV mode during automatic channel tuning, allows reliable channel tuning without misjudging the presence or absence of signals even if the frequency of the CATV broadcast is shifted, reduces the time required for automatic channel tuning, and outputs sharp images.

Going further into the embodiment of the present invention, the channel tuning apparatus comprises a tuner for tuning to any of channels that broadcast digital signals in multiple system modes and receiving the digital signals; input means for selecting a specific channel for the tuner to tune to; demodulation means for amplifying, detecting, demodulating, and converting the received signals coming from the tuner; detection means for detecting receive data in the output signals of the demodulation means to determine the system mode and frequency mode of the channel tuned by the tuner; and memory means for storing mode data detected by the detection means, based on the channel selection by the input means. The channel tuning apparatus is configured to, before performing automatic channel tuning with respect to the broadcast, make the tuner tune to the specific channel determined by the input means, make the detection means detect the system mode of the specific channel and the shift in the received frequency on the specific channel, and store them in the memory means, and the channel tuning apparatus is further configured to, when digital signals are received by the tuner in the automatic channel tuning, use the stored data as initial data for the automatic channel tuning to tune to and pull in the digital signals.

According to this configuration, the channel tuning apparatus receives signals of CATV broadcasting having multiple broadcast modes, and detects and stores the broadcast mode and the frequency mode of the channel selected by the user during automatic channel tuning out of the channels that carry signals or the channel numbers that can be received, whereby the stored data is referred to as the initial data for automatic channel tuning to tune in and pull in digital signals when the digital signals are received by a tuner.

Also, the channel tuning apparatus is configured to, before performing automatic channel tuning, determine whether or not signals are present on the specific channel selected by the input means. If it is determined that signals are present, the channel tuning apparatus searches an effective range of the received frequency of the received system mode in sequence and detects and stores any frequency shift for use as initial data in automatic channel tuning. On the other hand, if it is determined that no signal is present, the channel tuning apparatus detects and stores the frequency shift on the first signal-carrying channel found after starting the automatic channel tuning, and the stored information is used as initial data in the automatic channel tuning.

According to this configuration, when detecting the CATV broadcast mode of a user-selected available channel, if the user selects a channel that carries no signal or if the user selects a wrong channel, the channel tuning apparatus starts automatic channel tuning with the reference CATV mode set to STD mode and the frequency mode set to Center mode as initial data, detects and stores the receive mode and frequency shift of the CATV broadcast with respect to the first signal-carrying channel detected after starting the automatic channel tuning, and refers to the stored data as the initial data for automatic channel tuning to tune in and pull in digital signals when the digital signals are received by a tuner.

Also, before performing automatic channel tuning, the channel tuning apparatus sequentially searches the effective range of the received frequency for the system mode of the channel detected by the detection means by adding some margin to the range, detects and stores the frequency shift of each retrieved signal with respect to the center frequency, and uses the stored information as initial data in the automatic channel tuning.

Thus, the channel tuning apparatus is configured to detect and store channels beginning with the channel selected by the user out of available channels or the first signal-carrying channel found after starting automatic channel tuning, start channel tuning beginning with the Center frequency mode, determine the reference frequency mode by searching a certain effective range in sequence, and perform automatic channel tuning with reference to the reference frequency mode, thereby allowing channel tuning even if the frequency is shifted due to some influence.

BRIEF DESCRIPTION OF THE DRAWINGS

FIG. 5 is a diagram illustrating information about presence or absence of signals on individual channels;

FIG. 6 is a diagram illustrating picture carrier frequencies for channels of CATV broadcasting systems.

DESCRIPTION OF THE EMBODIMENT

Figure 1:
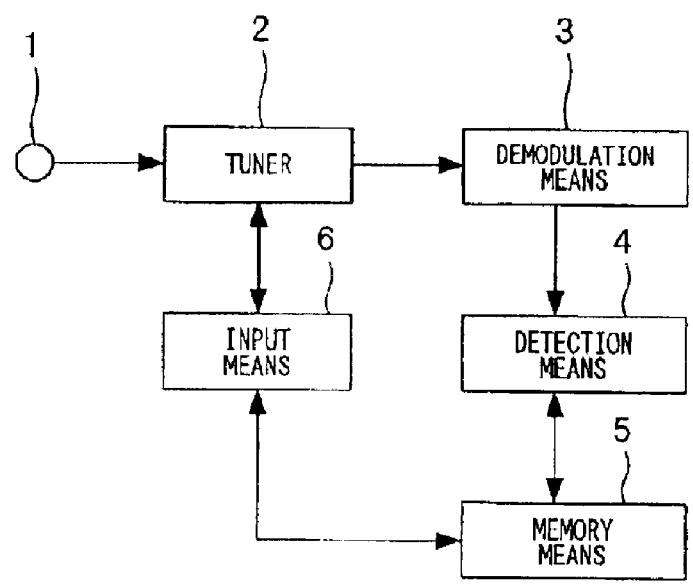
FIG. 1 is a block diagram showing a configuration of a channel tuning apparatus according to an embodiment of the present invention.
Figure 2:
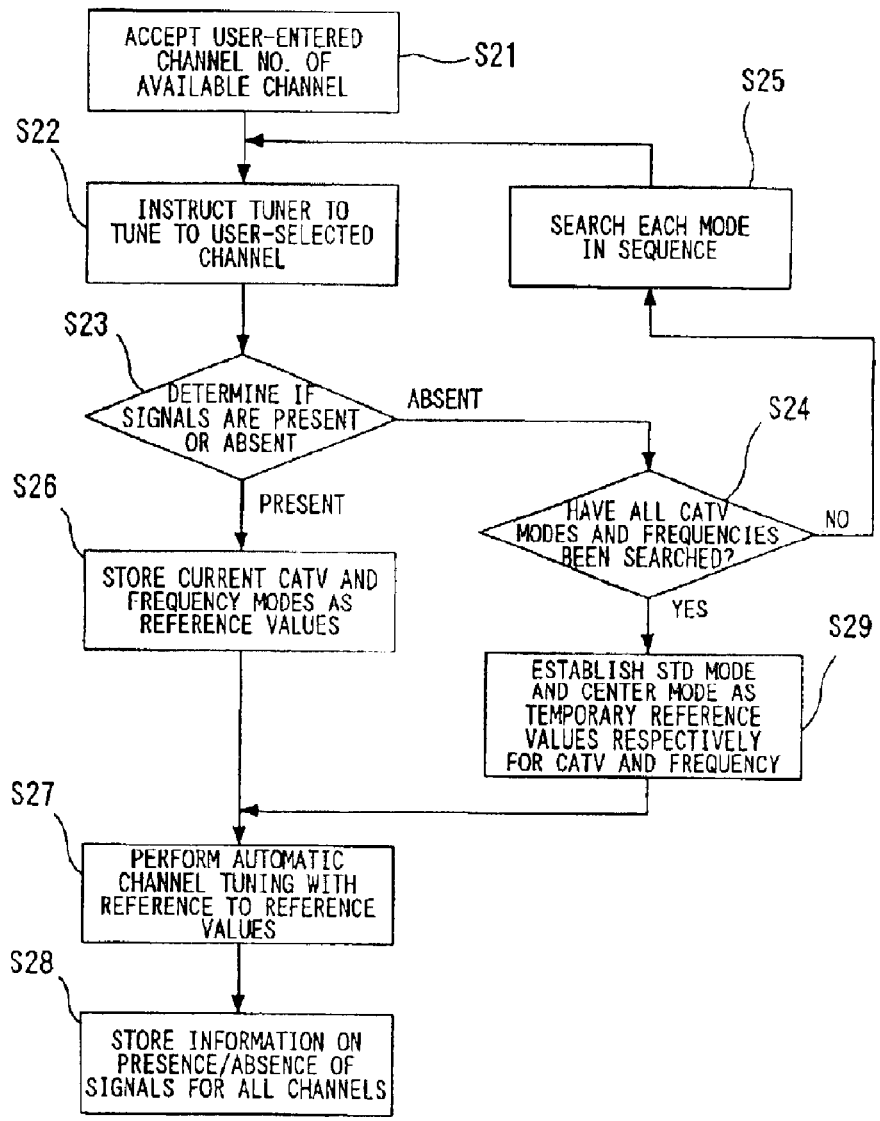
FIG. 2 is a flowchart showing an operation of CATV mode selection according to the embodiment.
Figure 3:
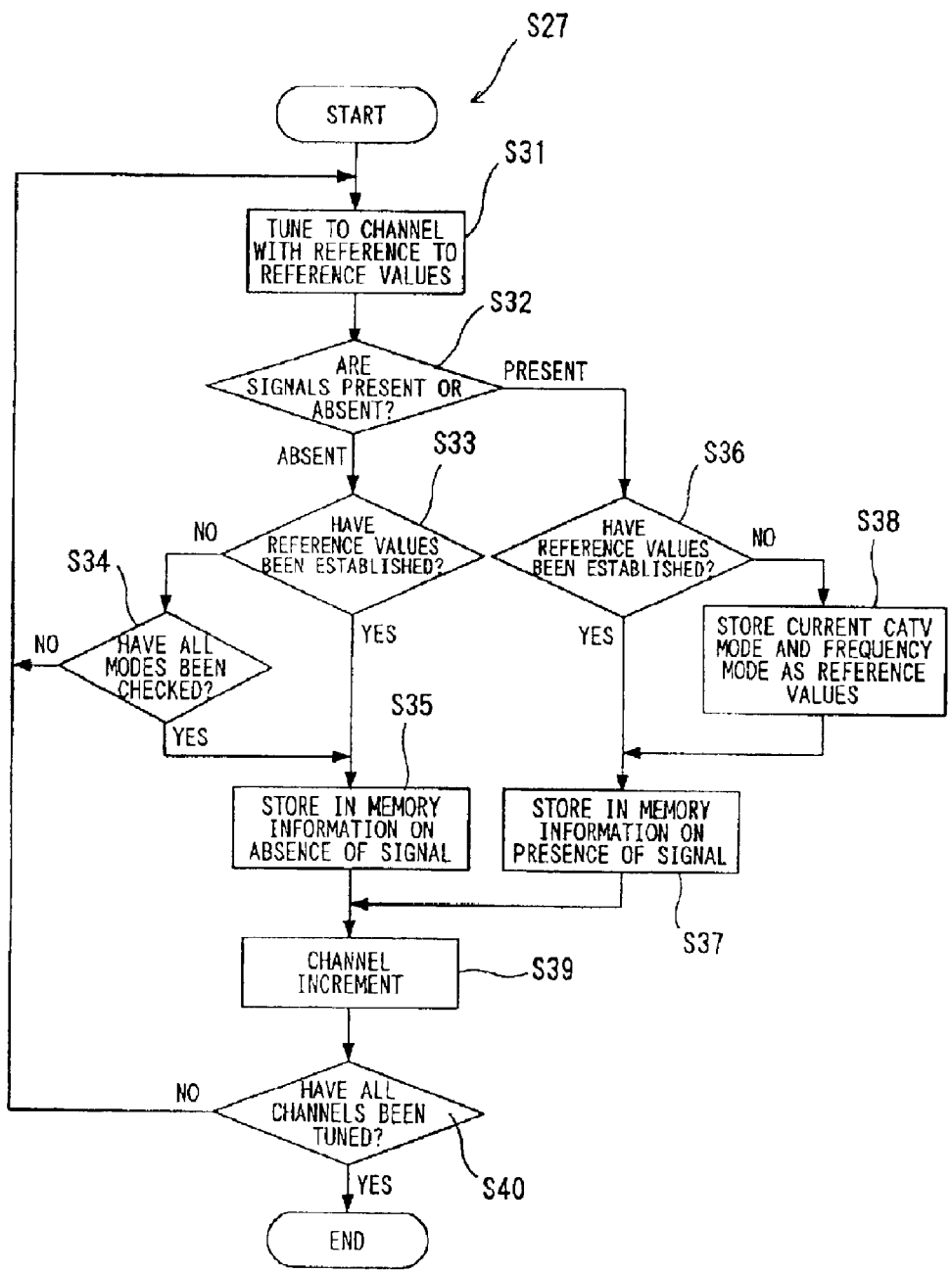
FIG. 3 is a flowchart showing an operation of automatic channel tuning according to the embodiment.
Figure 4:
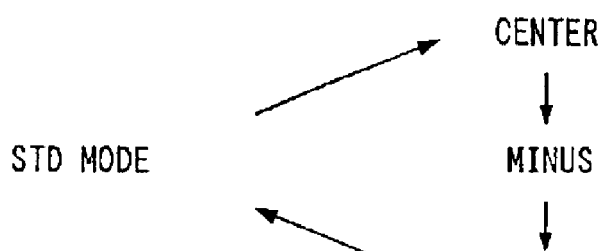
FIG. 4 is a diagram illustrating reference mode search patterns according to the embodiment.
Figure 4:
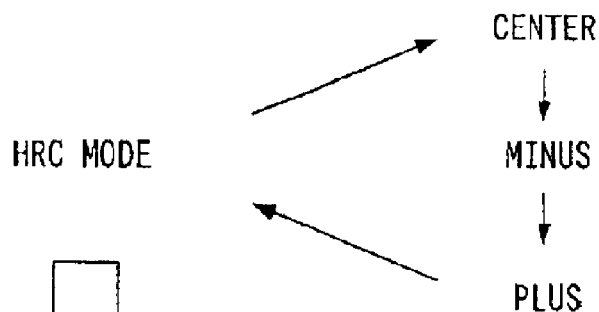
Figure 4:
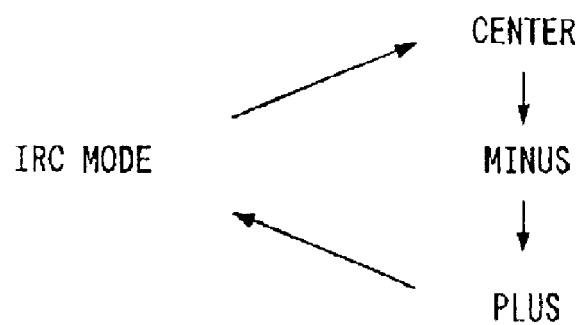
Figure 5:
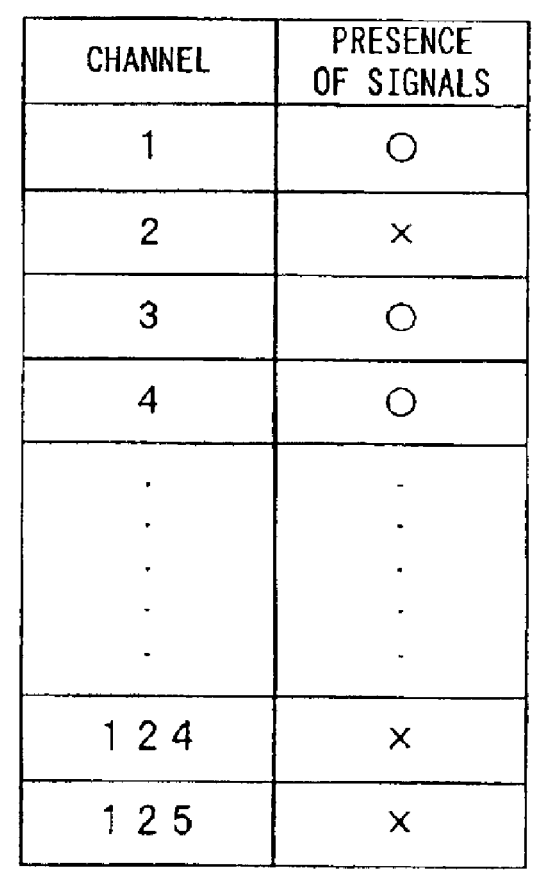
Figure 7:
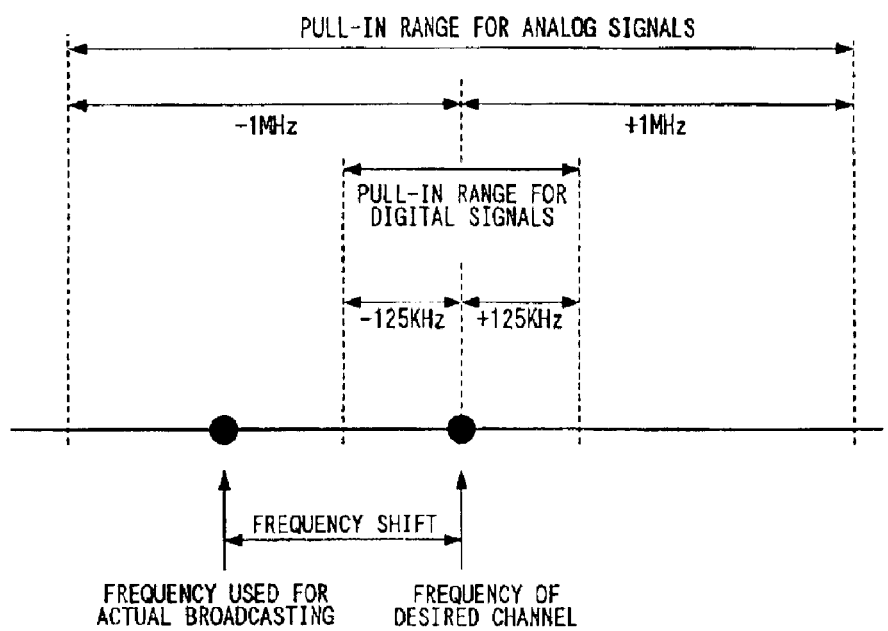
FIG. 7 is a diagram illustrating a channel tuning method of a conventional channel tuning apparatus.

FIG. 1 is a block diagram showing a configuration of a channel tuning apparatus according to an embodiment of the present invention. FIG. 2 is a flowchart showing an operation of CATV mode selection. FIG. 3 is a flowchart showing an operation of automatic channel tuning. FIG. 4 is a diagram illustrating reference mode search patterns. FIG. 5 is a diagram illustrating information about presence or absence of signals on individual channels.

Now, the operation performed after a user selects a CATV mode will be described. Regarding CATV broadcast signals supplied to an antenna, each channel can only be in one broadcast mode out of the STD, HRC, and IRC modes at a time, and different modes never coexist on the same channel. The operation of searching all the channels regardless of the presence or absence of signals and storing signal-carrying channels is referred to as automatic channel tuning.

Before performing automatic channel tuning, it is necessary to set an appropriate CATV broadcast mode (STD, HRC, and/or IRC mode) as well as appropriate initial data (also called a reference mode) out of the three frequency modes (Center, Minus, and Plus modes), which represent the shift between the frequency of the signals actually delivered and the frequency of the desired channel.

In the block diagram shown in FIG. 1, the modes are set as follows: before automatic channel tuning, the CATV mode is set to STD mode and the frequency mode is initialized to Center mode and the user is asked to enter, through input means 6, the number of a channel that can be received, i.e., a channel that carries signals.

Next, the channel tuning apparatus calculates the frequency on the desired channel, i.e., the channel that corresponds to the entered channel number, from the current CATV mode and frequency mode, makes a tuner 2 tune in and receive the digital signals of the calculated frequency through an antenna terminal 1, and makes demodulation means 3 amplify, detect and demodulate the digital signals into signals that can be detected by detection means 4.

Then, the channel tuning apparatus makes the detection means 4 check, with reference to the signals converted by the demodulation means 3, whether the channel carries signals. If it is determined that the channel carries signals, the channel tuning apparatus establishes the current CATV mode as the reference CATV mode, and the current frequency mode as the reference frequency mode. If it is determined that the channel does not carry signals, the channel tuning apparatus searches for signals by changing the CATV mode and frequency mode in sequence according to the search patterns in FIG. 4. Then it repeats the process beginning with receiving a channel number entered by the input means 6.

If the channel tuning apparatus cannot determine, after trying all the search patterns, that the channel carries signals, it sets the reference CATV mode to STD mode and the reference frequency mode to Center mode. Then it makes memory means 5 store the reference CATV mode and reference frequency mode set by the detection means 4.

If the reference modes are acquired in this way before automatic channel tuning, all the channels can be tuned to in sequence according to the reference modes and be checked for signals in actual automatic channel tuning. This eliminates the need to change the CATV mode and frequency mode for each channel and thus reduces the time required for automatic channel tuning.

Now the above operation will be described in detail with reference to the flowchart of FIG. 2.

Steps S21 to S25, Step S26, and Step 29 represent the search process for reference modes before automatic channel tuning. In other words, they represent the process for acquiring a reference CATV mode and reference frequency mode before performing automatic channel tuning.

In Steps S21 and S22, the channel tuning apparatus makes the tuner tune to the user-selected available channel according to the initialized CATV mode and frequency mode of that channel. In Step S23, the channel tuning apparatus checks the tuned channel for signals.

If the channel tuning apparatus determines in Step S23 that signals exist on the channel selected by the user, it goes to Step S26, where it stores the current CATV mode and frequency mode as the reference CATV mode and reference frequency mode.

If the channel tuning apparatus determines in Step S23 that no signal exists on the channel selected by the user, it goes to step S24, where it checks whether attempts to tune to the channel were made in all the CATV modes (STD, HRC, and IRC) and whether the frequency-mode searches were made in the effective range (Center, Plus, and Minus), i.e., whether all the search patterns in FIG. 4 were tried.

If the channel tuning apparatus determines in Step S24 that all the search patterns shown in FIG. 4 were tried before failing to find any signal on the channel, it goes to Step S29, where it sets the reference CATV mode to STD mode, and the reference frequency mode to Center mode, to establish these modes as temporary reference values. Then it moves to the next step.

If the channel tuning apparatus determines in Step S24 that not all the search patterns were tried, it goes to Step S25, where it repeats Steps S22 to S25 by changing both CATV mode and frequency mode according to the search patterns in FIG. 4 until all the patterns are tried.

The basic search patterns used for the process of Step S25 are shown in FIG. 4. As shown in FIG. 4A, three CATV modes, STD mode, HRC mode, and IRC mode, are available for CATV broadcasting. Besides, as shown in FIG. 4B, three frequency modes, Center mode, Minus mode, and Plus mode, are available to determine the shift in the frequency of the desired channel.

Search operations are performed in the following order. First, a search operation is performed with the CATV mode set to STD mode and the frequency mode set to Center mode. Next, a search operation is performed with the CATV mode as it is and the frequency mode switched to Minus mode. Next, a search operation is performed with the CATV mode as it is and the frequency mode switched to Plus mode. Then, a search operation is performed with the CATV mode set to HRC mode and the frequency mode set to Center mode. Subsequently, search operations are performed by changing the CATV mode and frequency mode in sequence as shown in FIG. 4.

After the reference modes are stored in Steps S26 and S29, the channel tuning apparatus performs automatic channel tuning in Step S27 according to the reference modes stored in the previous step.

Now the automatic channel tuning operation performed in Step S27 will be described in detail with reference to FIG. 3. As shown in the figure, the channel tuning apparatus starts channel tuning in Step S31 according to the stored reference CATV mode and reference frequency mode. In the case of a CATV broadcast, the channels to be tuned are CH1 to CH125 as shown in FIG. 6.

Next, the channel tuning apparatus determines in Step S32 whether or not signals are present on the channel tuned according to the reference CATV mode and reference frequency mode. If no signal is present, the channel tuning apparatus goes to Step S33, where it determines whether or not current CATV and frequency modes were established before automatic channel tuning. In other words, the channel tuning apparatus determines whether or not the reference modes were established after signals were found in the user-selected channel or the reference CATV mode and reference frequency mode were set temporarily to STD mode and Center mode when no signal was found after trying all the search patterns.

If the channel tuning apparatus determines in Step 533 that reference modes have been established, it goes to Step S35, where it stores information on absence of signals. An example of information on the presence or absence of signals is shown in FIG. 5. If the channel tuning apparatus determines in Step S33 that no reference mode has been established, that is, if temporary reference modes are used, the channel tuning apparatus determines in Step 534 whether or not all the patterns described above have been tried in order to establish the reference CATV mode and reference frequency mode, that is, whether or not searches were performed in the CATV modes (STD mode, HRC mode, and IRC mode) and the frequency modes (Center mode, Minus mode, and Plus mode) according to the search patterns in FIG. 4.

If it is found in Step S34 that searches have been performed using all the patterns, the channel tuning apparatus goes to Step S35, where it determines that there is no signal on the channel currently tuned to, and stores information on the absence of signals. If it is found in Step S34 that not all the patterns were used for searches, the channel tuning apparatus changes the modes according to the search patterns in FIG. 4 and repeats the process beginning with Step S31.

Now description will be given about the case in which signals are detected on the desired channel tuned to in Step S32.

If signals are present, the channel tuning apparatus checks in Step S36, as is the case with Step S33, whether current reference modes have been established. If they have been, the channel tuning apparatus goes to step S37, where it stores information on the presence of signals in memory. If it is determined in Step S36 that no current mode has been established, the channel tuning apparatus goes to step S38, where it establishes the CATV mode and frequency mode which are currently being tuned as the reference CATV mode and reference frequency mode, and stores them together with the information on the presence of signals. This means that reference modes are established. Then in Step S37, the channel tuning apparatus stores the information on the presence of signals in memory.

Next, the channel tuning apparatus makes preparations for the tuning of the next channel in Step S39 and determines in Step S40 whether all the channels (CH1 to CH125) have been tuned. If not all the channels have been tuned, the channel tuning apparatus repeats the process starting with Step S31. If all the channels have been tuned, the information on the presence or absence of signals for all the channels, which was obtained in Step S27, is stored in Step S28 shown in FIG. 2.

In this way, if CATV modes and frequency shifts are acquired and stored as established reference modes before automatic channel tuning, the time required for automatic channel tuning can be reduced significantly.

Regarding the problem of narrow pull-in range during the tuning of digital signals, it can be dealt with by establishing a certain effective range (Center mode, Minus mode, or Plus mode) as a reference frequency mode which represents the shift from the frequency of the desired channel. In this way, it is possible to tune to the desired channel and output sharp images even if the frequency of the CATV broadcast signals supplied to the antenna terminal is shifted from the frequency of the desired channel.

Although automatic channel tuning of digital CATV broadcasting has been described above as an example, the present invention can similarly be applied to normal tuning, that is, manual channel tuning.

What is claimed is:

1. A channel tuning apparatus, comprising:

a tuner for tuning to any of channels that broadcast digital signals in multiple system modes and receiving the digital signals;

input means for selecting a specific channel for said tuner to tune to;

demodulation means for amplifying, detecting, demodulating, and converting the received signals coming from said tuner;

detection means for detecting receive data in the output signals of said demodulation means to determine the system mode and frequency mode of the channel tuned by said tuner; and memory means for storing mode data detected by said detection means, based on the channel selection by said input means, wherein the channel tuning apparatus is configured to, before performing automatic channel tuning with respect to said broadcast, make said tuner tune to said specific channel determined by said input means, make said detection means detect the system mode of said specific channel and a shift in the received frequency on said specific channel, and store them in said memory means, and the channel tuning apparatus is configured to, when digital signals are received by said tuner in said automatic channel tuning, use the stored data as initial data for said automatic channel tuning to tune to and pull in said digital signals.

2. The channel tuning apparatus according to claim 1, wherein:

before performing the automatic channel tuning, it is determined whether or not signals are present on the specific channel selected by the input means; and if it is determined that signals are present, an effective range of the received frequency of the received system mode is searched in sequence, and any frequency shift is detected and stored for use as initial data in said automatic channel tuning; and if it is determined that no signal is present, a frequency shift on a first signal-carrying channel found after starting said automatic channel tuning is detected and stored for use as initial data in said automatic channel tuning.

3. The channel tuning apparatus according to claim 1, wherein said channel tuning apparatus is configured to, before performing automatic channel tuning, sequentially search an effective range of the received frequency for the system mode of the channel detected by the detection means by adding some margin to the range, detect and store the frequency shift of each retrieved signal with respect to a center frequency, and use the stored information as initial data in said automatic channel tuning.

* * * * *